US008696941B2

(12) United States Patent  (10) Patent No.: US 8,696,941 B2
Brabec et al.  (45) Date of Patent: *Apr. 15, 2014

(54) MATERIAL FOR FUNCTIONAL LAYER OF ORGANIC ELECTRONIC COMPONENT

(75) Inventors: Christoph Josef Brabec, Linz (AU); Karsten Heuser, Regensburg (DE); Henning Rost, Erlangen (DE)

(73) Assignee: Merck Patent GmbH (DE)

( * ) Notice: Subject to any disclaimer, the term of this patent is extended or adjusted under 35 U.S.C. 154(b) by 298 days.

This patent is subject to a terminal disclaimer.

(21) Appl. No.: 12/985,145

(22) Filed: Jan. 5, 2011

(65) Prior Publication Data

US 2011/0095236 A1  Apr. 28, 2011

Related U.S. Application Data

(63) Continuation of application No. 10/515,159, filed as application No. PCT/DE03/01867 on Jun. 5, 2003, now Pat. No. 7,871,543.

(30) Foreign Application Priority Data

Jun. 14, 2002 (DE) .................. 102 26 669

(51) Int. Cl.
 *H01B 1/12* (2006.01)
 *C08G 75/00* (2006.01)
 *B05D 5/12* (2006.01)
(52) U.S. Cl.
 USPC ......... 252/500; 252/301.32; 427/466; 427/58
(58) Field of Classification Search
 USPC .............. 252/301.32, 500, 582, 501.1; 428/411.1, 489, 690, 704, 917; 313/503, 506–507; 427/66, 74, 80, 427/212, 256, 384, 466; 528/373, 377
See application file for complete search history.

(56) References Cited

U.S. PATENT DOCUMENTS

| 5,232,631 A | 8/1993 | Cao et al. |
| 6,372,154 B1 | 4/2002 | Li |
| 6,692,662 B2 | 2/2004 | Haghighat et al. |

(Continued)

FOREIGN PATENT DOCUMENTS

| DE | 3634281 A1 | 4/1988 |
| DE | 4100202 A1 | 8/1991 |

(Continued)

OTHER PUBLICATIONS

Kim, J.Y et al., "Enhancement of Electrical Conductivity of Loly(3,4-ethilenedioxythiophene)/Poly(4-styrenesulfonate) by a Change of Solvent", *Synthetic Metals*, vol. 126, No. 2-3, pp. 311-316, 2002, XP-001189321.

(Continued)

*Primary Examiner* — Stanley Silverman
*Assistant Examiner* — Kallambella Vijayakumar
(74) *Attorney, Agent, or Firm* — Bowditch & Dewey, LLP; Roger P. Zimmerman

(57) ABSTRACT

The invention relates to a material for applying thin organic layers having a specifically adjustable conductivity. Said material comprises at least one mixture of two different fractions of a functional polymer, preferably in a solvent, and is used, for example, with the aid of various application techniques, as a functional layer for an organic electronic component.

17 Claims, 1 Drawing Sheet

(56) References Cited

U.S. PATENT DOCUMENTS

| | | | |
|---|---|---|---|
| 7,008,562 B2 * | 3/2006 | Jonas et al. | 252/500 |
| 7,122,130 B2 | 10/2006 | Tahon et al. | |
| 7,871,543 B2 * | 1/2011 | Brabec et al. | 252/500 |
| 2002/0038999 A1 | 4/2002 | Cao et al. | |
| 2002/0136923 A1 * | 9/2002 | Jonas et al. | 428/690 |
| 2003/0006401 A1 | 1/2003 | Haghighat et al. | |
| 2003/0215571 A1 | 11/2003 | Tahon et al. | |

FOREIGN PATENT DOCUMENTS

| | | |
|---|---|---|
| DE | 19841803 A1 | 3/2000 |
| DE | 10103416 A1 | 8/2002 |
| EP | 1 081 548 | 3/2001 |
| EP | 1 081 5418 | 3/2001 |
| JP | 2000-090732 | 3/2000 |
| WO | WO 01/81012 | 11/2001 |
| WO | WO 02/67273 | 8/2002 |

OTHER PUBLICATIONS

Cui et al., "An Organic Poly(3,4-Ethylenedioxythiophene) Field-Effect Transistor Fabricated by Spin Coating and Reactive Ion Etching," *IEEE Trans. Electron Dev.*, 50(5):1419-1422 (May 2003).

\* cited by examiner

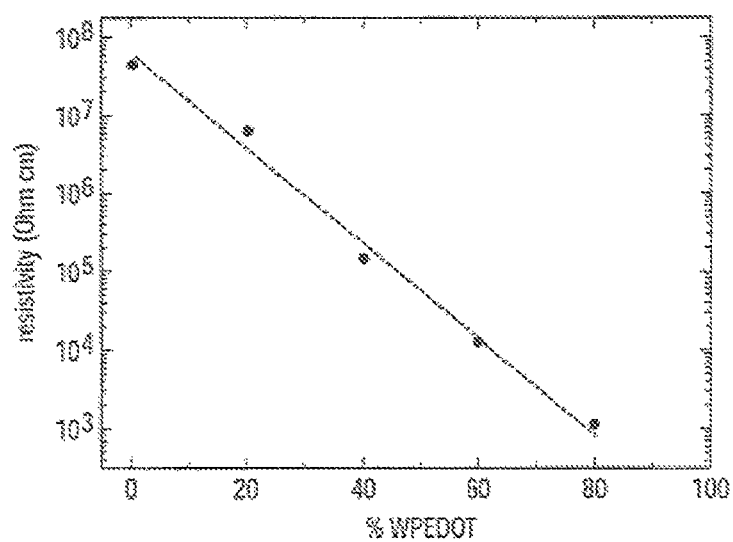

MATERIAL FOR FUNCTIONAL LAYER OF ORGANIC ELECTRONIC COMPONENT

CROSS REFERENCE TO RELATED APPLICATIONS

This application is a continuation of and claims priority under 35 U.S.C. §120 to U.S. patent application Ser. No. 10/515,159, filed Nov. 19, 2004, now U.S. Pat. No. 7,871,543, which claims priority under 35 U.S.C. §371 to international application number PCT/DE2003/001867, filed Jun. 5, 2003, which in turn claims priority to German application number 102 26 669.7, filed Jun. 14, 2002. The contents of these applications are hereby incorporated by reference.

TECHNICAL FIELD

The invention concerns a material for a functional layer of an organic electronic component, particularly one that can be formed of a conducting, a semiconducting and an insulating functional layer in combination.

BACKGROUND

Materials for functional layers based on PEDOT/PSS [poly (3,4-ethylenedioxythiophene)/poly(styrene sulfonate)] or PANI (polyaniline/PSS) are known.

These materials yield functional layers in the form of thin films of the functional polymer concerned.

Heretofore, to produce a given functional layer it has been necessary to process a material specifically suited for that layer via application techniques such as spin coating, etc. Disadvantageously, especially in connection with the mass production of "disposable electronics" such as electronic bar chips, ID tags, etc., multiple functional polymers that have to be processed under different conditions have been used for components of this kind.

DESCRIPTION OF DRAWING

FIG. 1 illustrates the relationship between the resistivity of a mixture prepared from WPEDOT and EPEDOT and the weight ratio of the WPEDOT used to prepare the mixture.

DETAILED DESCRIPTION

The object of the instant invention is, therefore, to create a material that can be used for all the functional layers of an electronic component, so that production techniques can be simplified and thus configured in a more cost-effective manner.

It is the general realization of the invention that the conductivity of a mixture of different fractions of a single functional polymer can be adjusted via the mixing ratio, the rheological properties of the mixture being unaffected by the mixing ratio of the fractions.

The invention is directed to a material for forming a functional layer of an electronic component having an adjustable conductivity, said material comprising a mixture of at least two fractions of a functional polymer, specifically a first fraction based on a dispersion of the functional polymer in a first solvent in which the functional polymer is at least partially dispersed and a second fraction of functional polymer based on a true solution of the functional polymer in a second solvent, the two fractions being jointly processed, dispersed and/or dissolved and the conductivity of the functional layer formed of these materials being adjustable by means of the mixing ratio of the at least two fractions, in conjunction with the thickness of the functional layer. The invention is also directed to a method for the production of a material for a functional layer of an electronic component, wherein a mixture of two different fractions of a functional polymer, optionally in a solvent, is combined.

According to one embodiment of the method, a dispersion of the functional polymer and a solution of the functional polymer are mixed with high-boiling solvent and the lower-boiling solvents are then removed by distillation in such a way that ultimately the different fractions of functional polymer in the high-boiling solvent substantially constitute the material. One embodiment of the method provides that the high-boiling solvent is to be added in the same proportions as those in which the fractions concerned are present.

According to an advantageous embodiment, the material is substantially free of the solvent and/or dispersant of the initial fractions and/or comprises an additional, third solvent. The material can contain any of the supplemental admixtures and additives customarily and/or appropriately used in these types of materials, such as antifoaming agents, wetting agents, etc.

The term "material" always denotes herein the material according to the invention for forming a functional layer of an organic electronic component.

According to another embodiment, prior to dispersion or dissolution, each of the two fractions is present as dry matter.

"The two fractions" denotes two modifications, i.e., two presumably different states, of one material.

In an advantageous embodiment, the functional polymer is PEDOT or PANT.

In an advantageous embodiment, the functional polymer is present as a copolymer or a mixture containing PSS (polystyrene sulfonate) in the form of anions.

In an embodiment, the first solvent is water or another high-polarity component in which the functional polymer is substantially insoluble.

In one embodiment of the invention, the second solvent is ethanol or another low-boiling, polar solvent, preferably a polar-protic solvent able to form hydrogen bridge bonds.

The term "low-boiling" is understood herein to mean solvents having a boiling point of up to 150° C.

In one embodiment, the third solvent is different from the first and/or second solvents.

In an advantageous embodiment, the third solvent is ethylene glycol or another alcohol, particularly also mixtures of a plurality of alcohols, and/or alcohols having a carbon content of from C4 to C10, branched and unbranched, also polyvalent alcohols, or mixtures thereof, as well as mixtures with water, especially preferably glycol and glycerol.

The term "solution" is used when individual polymer particles are substantially surrounded by solvent molecules, and is in contradistinction to the term "dispersion," which denotes the state in which the individual polymer particles conglomerate and, for example, form clusters but do not precipitate or settle out, but instead are substantially dispersed in the [noun missing] and form no precipitate, i.e., larger clumps of solid. Whether a component is identified herein as a solvent or a dispersant depends only on how the functional polymer in question behaves in that medium. The conditions prevailing during production, storage and/or processing are to be considered in each case.

The term "organic material" or "functional material" or "functional polymer" encompasses herein all types of organic, metalorganic and/or organic/inorganic synthetics (hybrids), particularly those denoted in English, for example, by the term "plastics." This includes all types of materials except the semiconductors that form conventional diodes (germanium, silicon) and typical metallic conductors. Hence, there is no intention to limit the term in the dogmatic sense to organic material as carbon-containing material, but rather, the broadest use of silicones, for example, is contemplated. Furthermore, the term is not to be construed as limited with respect to molecular size, particularly to polymeric and/or oligomeric materials, but instead the use of "small molecules" is completely feasible. The word "polymer" in "functional polymer" is historically derived and makes no statement as to the presence of any actual polymeric compound and no statement as to whether or not the material is a polymer mixture or a copolymer.

"Dry matter" denotes herein a material that is substantially free of solvent.

"Organic, electronic component" denotes herein, for example, a transistor, a diode, an optocoupler, a solar cell, an organic light-emitting diode, organic lamps, a display (active and passive matrix), a conductive fabric, an antistatic coating, or an optoelectronic component.

The invention is explained further herein below with reference to a production example.

For the first time, conductivity is modified here by many orders of magnitude without any change in the solvent environment. The mixture used is exemplarily composed of two different PEDOT solutions (both with the same solvent, e.g. ethylene glycol) that have different conductivities by virtue of their prior history (the one solution is manufactured as a water-based solution and the other as an ethanol-based solution). The solution obtained from water-based PEDOT (WPEDOT) has a resistivity of $10^2$ $\Omega$cm and that obtained from ethanol-based PEDOT (EPEDOT) has a resistivity of $10^7$ $\Omega$cm.

Since the necessary surface conductivity is usually an important factor in components, the layer thickness (between 5 nm and 500 µm) can be adjusted to vary the surface conductivity by as much as ten orders of magnitude. A surface resistance is generally defined for this purpose. For example, the ITO used as an anode in LCDs, OLEDs or solar cells has a sheet resistance of 20 ohms/square. A PEDOT mixture of 10 S/cm (corresponding to a resistivity of $10^{-1}$ ohm-cm) attains these conductive properties with a layer thickness of 5 µm.

To produce the starting materials WPEDOT and EPEDOT, equal volumes of ethylene glycol are added to the original solutions, which are sold commercially by HC Starck for example, inter alia, and the original solvent is then distilled off in a rotary evaporator. Since ethylene glycol does not distill at temperatures of less than 200° C., a pure glycolic PEDOT solution remains. The nature of the original materials WPEDOT and EPEDOT being different from this, in the case of WPEDOT, owing to the dispersive character of this material its conductivity is drastically reduced by the replacement of water with ethylene glycol. In the case of EPEDOT, which is a true solution, the conductivity of the material is not changed by replacing ethanol with ethylene glycol. The result, therefore, is two glycolic PEDOT variations whose conductivities differ by five orders of magnitude. The conductivity can now be adjusted within this interval by mixing (blending) the two solutions (see FIG. 1).

The instant invention is intended to solve the problem, described at the beginning hereof, of fine-tuning the conductivity of the polymer film over many orders of magnitude while preserving the optimum dissolution or dispersion properties for coating processes. This invention makes it possible for a polymer film whose conductivity can be selected arbitrarily over a broad range to be applied to a substrate in a structured manner or continuously over a large area with high resolution by means of a cost-effective coating process, such as silk screening, for example. This is possible because the conductivity of the polymer is varied by means of different mixing ratios for the first and second fractions of the functional polymer and/or by the choice of the third solvent, without the introduction of additives. The surface tension and viscosity therefore remain unchanged and the printability of the polymer is preserved.

It thereby becomes possible for the first time to construct an organic electronic component, such as a transistor, from different mixtures of a single material. This results in the so-called all-PEDOT transistor, composed of conducting PEDOT, semiconducting PEDOT and insulating PEDOT, which is several orders of magnitude less costly to manufacture than all those known heretofore.

The invention concerns a material (a polymer mixture) for forming a thin layer (5 nm to 500 µm) of adjustable conductivity. The material comprises at least one mixture of two different fractions of a functional polymer, preferably in a solvent.

The invention concerns a material for applying thin organic layers having a specifically adjustable conductivity. The material comprises at least one mixture of two different fractions of a functional polymer, preferably in a solvent, and is used, for example, with the aid of various application techniques, as a functional layer of an organic electronic component.

What is claimed is:

1. A material comprising:
a first fraction of a functional polymer in a dispersion comprising a first liquid;
a second fraction of the functional polymer in a solution comprising a second liquid; and
a solvent for the functional polymer, wherein the first liquid is different from the second liquid and the solvent, the solvent is different from the second liquid, each of the first and second liquids has a boiling point up to 150° C., and the solvent has a boiling point higher than the boiling points of the first and second liquids.

2. The material of claim 1, wherein the material is capable of being processed into a layer having a thickness of 5 nm to 500 µm.

3. The material of claim 1, wherein the solvent comprises an alcohol.

4. The material of claim 3, wherein the solvent comprises ethylene glycol.

5. The material of claim 1, wherein the functional polymer comprises PEDOT or PANI.

6. The material of claim 1, wherein the functional polymer is a copolymer or a mixture comprising PSS.

7. The material of claim 1, wherein the first liquid comprises water or a component in which the functional polymer is substantially insoluble.

8. The material of claim 7, wherein the first liquid comprises water.

9. The material of claim 1, wherein the second liquid comprises ethanol or a polar solvent.

10. The material of claim 9, wherein the second liquid comprises ethanol.

11. The material of claim 1, wherein the first liquid is water, the second liquid is ethanol, and the solvent is ethylene glycol.

12. A method, comprising: processing the material of claim 1 for the production of a functional layer having an adjustable conductivity, the processing is performed by spin coating, silk screening, offset printing, flexographic printing, spray coating, roller coating, inkjet printing, screen printing, or doctor blading.

13. A composition, comprising: a dispersion, comprising: a first liquid; and
a first portion of a functional polymer dispersed in the first liquid; a solution, comprising: a second liquid; and a second portion of the functional polymer dissolved in the second liquid; and a solvent for the functional polymer, wherein: the solvent, the dispersion and the solution are mixed together; the first liquid is different from the second liquid; the first liquid is different from the solvent; the solvent is different from the second liquid each of the first and second liquids has a boiling point up to 150° C., and the solvent has a boiling point higher than the boiling points of the first and second liquids.

14. The composition of claim 13, wherein the functional polymer comprises PEDOT or PANI.

15. The composition of claim 13, wherein the first liquid comprises water.

16. The composition of claim 13, wherein the second liquid comprises ethanol.

17. The composition of claim 13, wherein the solvent comprises ethylene glycol.

\* \* \* \* \*

UNITED STATES PATENT AND TRADEMARK OFFICE
CERTIFICATE OF CORRECTION

| | | |
|---|---|---|
| PATENT NO. | : 8,696,941 B2 | |
| APPLICATION NO. | : 12/985145 | |
| DATED | : April 15, 2014 | |
| INVENTOR(S) | : Christoph Josef Brabec et al. | |

It is certified that error appears in the above-identified patent and that said Letters Patent is hereby corrected as shown below:

Title Page Item (73) Assignee:

Replace "Merck Patent GmbH (DE)" with

-- Merck Patent GmbH (DE) and Osram Opto Semiconductors GmbH (DE) --.

Signed and Sealed this
Second Day of December, 2014

Michelle K. Lee
*Deputy Director of the United States Patent and Trademark Office*